(12) United States Patent
Gajiwala (10) Patent No.: US 11,002,416 B2
(45) Date of Patent: May 11, 2021

(54) INFORMATION HANDLING SYSTEM INCLUDING LIGHT-EMITTING DIODE LIGHTING FEATURE

(71) Applicant: Dell Products L.P., Round Rock, TX (US)

(72) Inventor: Priyank Jatin Gajiwala, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/292,675

(22) Filed: Mar. 5, 2019

(65) Prior Publication Data

US 2020/0284402 A1    Sep. 10, 2020

(51) Int. Cl.
| | |
|---|---|
| F21S 4/24 | (2016.01) |
| G02B 5/02 | (2006.01) |
| G06F 1/16 | (2006.01) |
| F21V 21/005 | (2006.01) |
| F21V 7/00 | (2006.01) |
| F21Y 115/10 | (2016.01) |
| F21S 4/22 | (2016.01) |
| F21Y 107/70 | (2016.01) |

(Continued)

(52) U.S. Cl.
CPC .............. F21S 4/24 (2016.01); F21V 7/0008 (2013.01); F21V 21/005 (2013.01); G02B 5/0278 (2013.01); G06F 1/1656 (2013.01); F21S 4/22 (2016.01); F21V 33/0052 (2013.01); F21Y 2107/10 (2016.08); F21Y 2107/70 (2016.08); F21Y 2115/10 (2016.08); G06F 11/325 (2013.01); H04M 1/22 (2013.01)

(58) Field of Classification Search
CPC ......... H04M 1/22; F21V 33/0052; F21S 4/22; F21S 4/24; F21Y 2107/70
See application file for complete search history.

(56) References Cited

U.S. PATENT DOCUMENTS

| | | | | |
|---|---|---|---|---|
| 6,215,602 B1* | 4/2001 | Kubo | ................... | H04B 1/3833 |
| | | | | 359/808 |
| 7,452,098 B2* | 11/2008 | Kerr | ...................... | G06F 1/1601 |
| | | | | 362/154 |

(Continued)

FOREIGN PATENT DOCUMENTS

DE    202012102874 U1 *    4/2013    ................ F21S 4/28

OTHER PUBLICATIONS

Lin, J., "Rohinni's Micro-LED Technology Initially Targets Keyboard Backlight Market," LEDinside of TrendForce Corp, Dec. 12, 2016, published on LEDinside (http://www.ledinside.com), 6 pages.

*Primary Examiner* — Alexander K Garlen
*Assistant Examiner* — Colin J Cattanach
(74) *Attorney, Agent, or Firm* — Zagorin Cave LLP (57) ABSTRACT

An information handling system includes an outer housing containing a processor configured to execute instructions to process information and a memory configured to store the information. The information handling system includes a plurality of light-emitting diodes (LEDs) and corresponding electrical conductors disposed along a length of the membrane. The information handling system includes a diffuser configured to diffuse light emitted by the plurality of LEDs to provide light having uniform intensity over a contiguous path along the outer housing.

23 Claims, 11 Drawing Sheets

(51) Int. Cl.
*F21Y 107/10* (2016.01)
*G06F 11/32* (2006.01)
*H04M 1/22* (2006.01)
*F21V 33/00* (2006.01)

(56) References Cited

U.S. PATENT DOCUMENTS

| | | | |
|---|---|---|---|
| 9,247,149 B2* | 1/2016 | Rolston | A45D 33/32 |
| 2004/0004835 A1* | 1/2004 | Tsai | F21K 9/00 |
| | | | 362/231 |
| 2005/0168987 A1* | 8/2005 | Tamaoki | F21V 5/04 |
| | | | 362/244 |
| 2009/0209302 A1* | 8/2009 | Kataoka | H04M 1/22 |
| | | | 455/575.1 |
| 2011/0018440 A1* | 1/2011 | Fukuda | G11B 33/025 |
| | | | 315/77 |
| 2011/0117959 A1* | 5/2011 | Rolston | A45D 40/18 |
| | | | 455/556.1 |
| 2011/0175747 A1* | 7/2011 | Small | H04M 1/0283 |
| | | | 340/815.45 |
| 2012/0275160 A1* | 11/2012 | Tada | H04M 1/22 |
| | | | 362/267 |
| 2015/0155903 A1* | 6/2015 | Jang | H04M 1/04 |
| | | | 455/575.8 |
| 2015/0276187 A1* | 10/2015 | Shoemake | G06F 1/1632 |
| | | | 362/235 |
| 2016/0230981 A1* | 8/2016 | Shoemake | H02J 7/00 |
| 2016/0374219 A1* | 12/2016 | Park | G02B 6/0083 |
| 2017/0146890 A1* | 5/2017 | Shoemake | H04M 1/22 |
| 2019/0342975 A1* | 11/2019 | Diana | H05B 47/11 |

* cited by examiner

INFORMATION HANDLING SYSTEM INCLUDING LIGHT-EMITTING DIODE LIGHTING FEATURE

BACKGROUND

Field of the Invention

The present invention relates to information handling systems, and more particularly to information handling systems including light-emitting diode (LED) lighting features.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Figure 1:
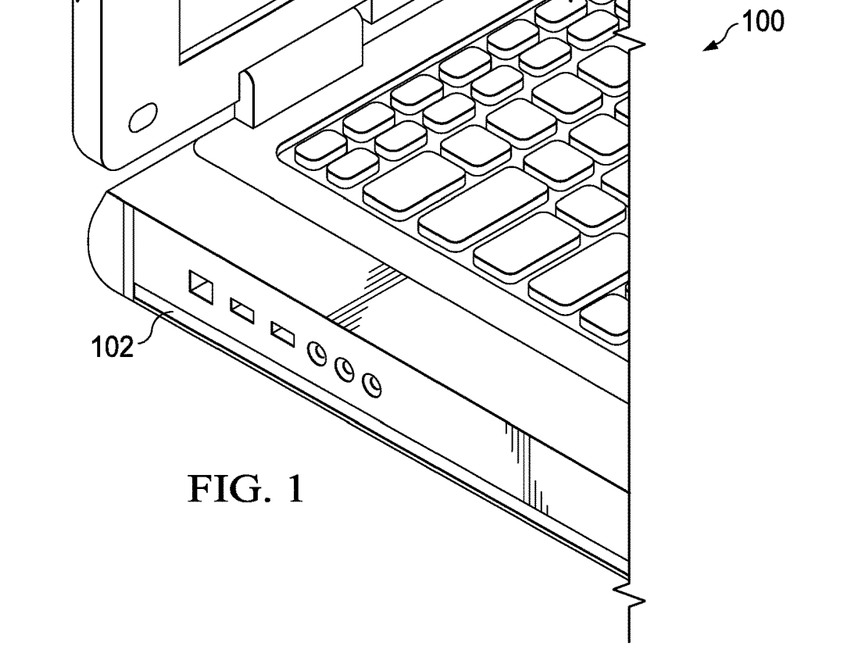
FIG. 1 illustrates a portion of conventional portable information handling system including a linear lighting feature.

In general, information handling systems may include a lighting feature for aesthetic or functional purposes. Referring to FIG. 1, a conventional portable information handling system includes lighting feature 102 implemented using side-firing or front-firing LEDs and a circular light-guide (e.g., 2 mm thick optical fiber). That implementation is well-suited for lighting features with linear designs. However, side-firing or front-firing LEDs coupled to a circular light guide may not provide uniform light intensity for lighting features having complex shapes or shapes requiring a material with a relatively small bend radius (e.g., bend radius $r_b$<15 mm for a 180 degree bend). In addition, a circular light guide with a diameter of 2 mm and the associated LED occupy substantial height, which increases the physical size and shape of the information handling system (i.e., increases the form factor). Accordingly, improved lighting techniques are desired.

SUMMARY OF EMBODIMENTS OF THE INVENTION

In at least one embodiment of the invention, an information handling system includes an outer housing. A processor is disposed in the outer housing. The processor is configured to execute instructions to process information. The information handling system includes a memory disposed in the outer housing. The memory is configured to store the information. The information handling system includes a membrane including a plurality of LEDs and corresponding electrical conductors disposed along a length of the membrane. The information handling system includes a diffuser configured to diffuse light emitted by the plurality of LEDs to provide light having uniform intensity over a contiguous path along the outer housing. The contiguous path may include at least one bend having a bend radius $r_b$, where 10 mm>$r_b$≥5 mm. The information handling system may include an outer cover. A portion of the diffuser may be disposed between the outer housing and the outer cover. The diffuser may include a molded diffuser and an airgap disposed between the membrane, the outer housing, and the molded diffuser. The membrane may be mounted in a niche of the outer housing and oriented to emit light into the airgap. The airgap may have a dimension between the membrane and the molded diffuser that is greater than or equal to a pitch of the plurality of LEDs along the length of the membrane. The diffuser may include a molded diffuser and an airgap disposed between the membrane, the outer housing, and the molded diffuser. The membrane may be mounted on an inner surface of the outer housing. The membrane may be oriented to cause the LEDs to emit light through an aperture through the outer housing. The inner surface may be curved and the membrane may curve in conformance to the inner surface. The diffuser may include an outer molded plastic insert, a diffuser film attached to the outer molded plastic insert, and an airgap disposed between the membrane and the diffuser film. The diffuser may include a first reflector. The membrane may be attached to a first surface of the diffuser between the diffuser and the first reflector. A second reflector may be attached to a second surface of the diffuser, the second surface opposing the first surface. The diffuser may be disposed between two surfaces of a niche in the outer housing.

In at least one embodiment of the invention, a method of manufacturing an information handling system includes attaching a membrane to a diffuser or an outer housing of the information handling system. The membrane includes a plurality of LEDs and corresponding electrical conductors disposed along a length of the membrane. The diffuser is configured to diffuse light emitted by the plurality of LEDs to provide light having uniform intensity over a contiguous path along the outer housing. The method includes inserting the diffuser into a niche in the outer housing. The contiguous path may include at least one bend having a bend radius $r_b$, where 10 mm>$r_b$≥5 mm. The membrane may be attached to the outer housing and the method may further include mounting the membrane in a niche of the outer housing. The membrane may be oriented to emit light into an airgap between the membrane, the outer housing, and the diffuser. The airgap may have a dimension between the LEDs and the diffuser that is greater than or equal to a pitch of the plurality of LEDs along the length of the membrane. The membrane may be attached to the outer housing and the method may further include mounting the membrane on an inner surface of the outer housing and the membrane may be oriented to cause the LEDs to emit light through an aperture through the outer housing, and into an airgap formed by the outer housing and the diffuser. The method may include attaching a diffuser film to an outer molded plastic insert and inserting the diffuser film and the outer molded plastic insert into a niche in the outer housing thereby forming an airgap between the membrane and the diffuser film. The method may include attaching a diffusive film to a curved light guide with reflective properties. The method may include attaching the membrane to a first surface of the diffuser between the diffuser and a first reflector. The method may include attaching a second reflector to a second surface of the diffuser, the second surface opposing the first surface. The diffuser may be disposed between two surfaces of a niche in the outer housing. The method may include inserting an outer cover into the niche in the outer housing, a portion of the diffuser being disposed between the outer housing and the outer cover.

In at least one embodiment of the invention, an apparatus includes an outer housing, a membrane including a plurality of LEDs and corresponding electrical conductors disposed along a length of the membrane, and a diffuser. The diffuser is configured to diffuse light emitted by the plurality of LEDs to provide light having uniform intensity over a contiguous path along the outer housing.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2A:
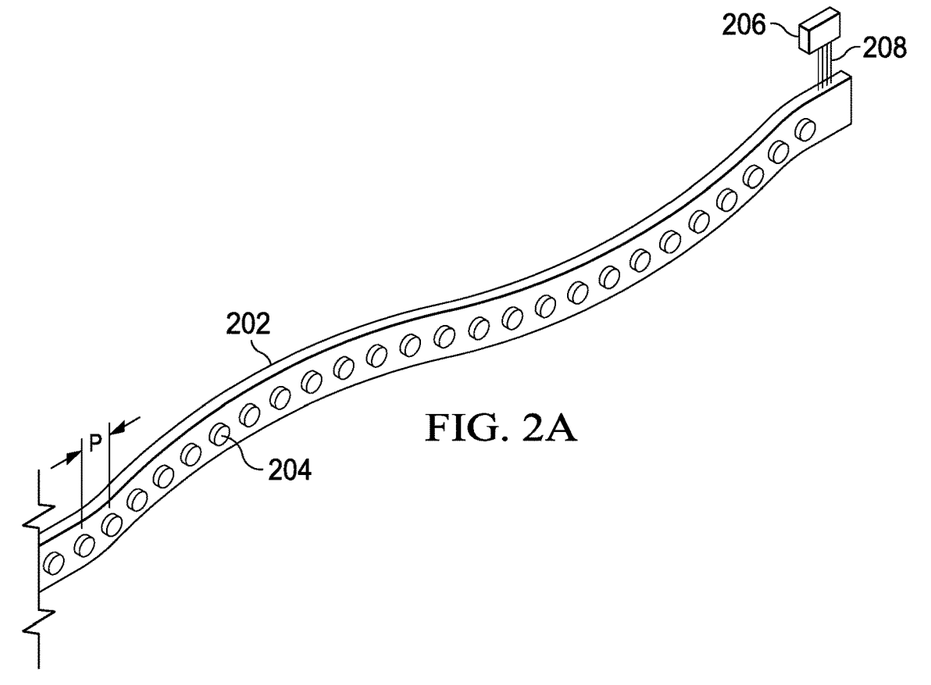
FIG. 2A illustrates an exemplary membrane including LEDs and associated electrical conductors.

Lighting features using flexible membranes including LEDs can achieve complex shapes that emit light with uniform intensity and consume less power than conventional lighting features. Referring to FIG. 2A, membrane 202 includes LEDs 204 and associated electrical interconnect 208, which extends along a length of membrane 202 and couples the LEDs to connector 206. In an embodiment, connector 206 is a conventional male 4-pin RGB connector. In at least one embodiment, membrane 202 and LEDs 204 have a combined thickness of approximately 0.2 mm. In at least one embodiment of membrane 202, each LED 204 is an integrated circuit die that is approximately 300 microns× approximately 170 microns in size and includes an RGB micro-LED unit, although other integrated circuit die sizes, single color micro-LEDs, or other types of LEDs may be used (e.g., LEDs having length or width dimensions between 10 microns to 2000 microns). In at least one embodiment, each red, green, or blue LED is formed using Gallium-Nitride manufacturing technology. In general, micro-LEDs have greater brightness, lower power, and thus, higher efficiency (e.g., lux/W) than other types of LEDs (e.g., side-firing or front-firing LEDs). Each RGB micro-LED consumes approximately 25-50% less power than conventional lighting techniques (e.g., side-firing or front-firing LEDs). In at least one embodiment, membrane 202 is formed of polyethylene terephthalate (i.e., poly(ethylene terephthalate (PET)), which is a flexible thermoplastic polymer resin. However, other materials (e.g., flexible printed circuit (FPC) polyimide film) may be used.

In at least one embodiment, membrane 202 has a minimum bend radius that is smaller than the bend radius of a light guide used in conventional LED products (e.g., $r_b$ of approximately 10 mm-15 mm for a conventional light guide). In general, a reduction of a minimum bend radius of a membrane is associated with increased flexibility of the membrane material. In at least one embodiment, membrane 202 has a minimum bend radius of approximately 5 mm. Accordingly, membrane 202 including LEDs can achieve more complex shapes than conventional LED products using circular light guides. A combination of 3D printing of electrical conductors (e.g., conductive traces) and pick-and-place techniques is used to dispose LEDs and form associated electrical conductors along a length of membrane 202. Although membrane 202 of FIG. 2A has a ribbon-like shape and includes only one row of LEDs, in other embodiments, membrane 202 has different geometries and includes multiple rows of LEDs that may be used to form different lighting patterns of LEDs.

Figure 2B:
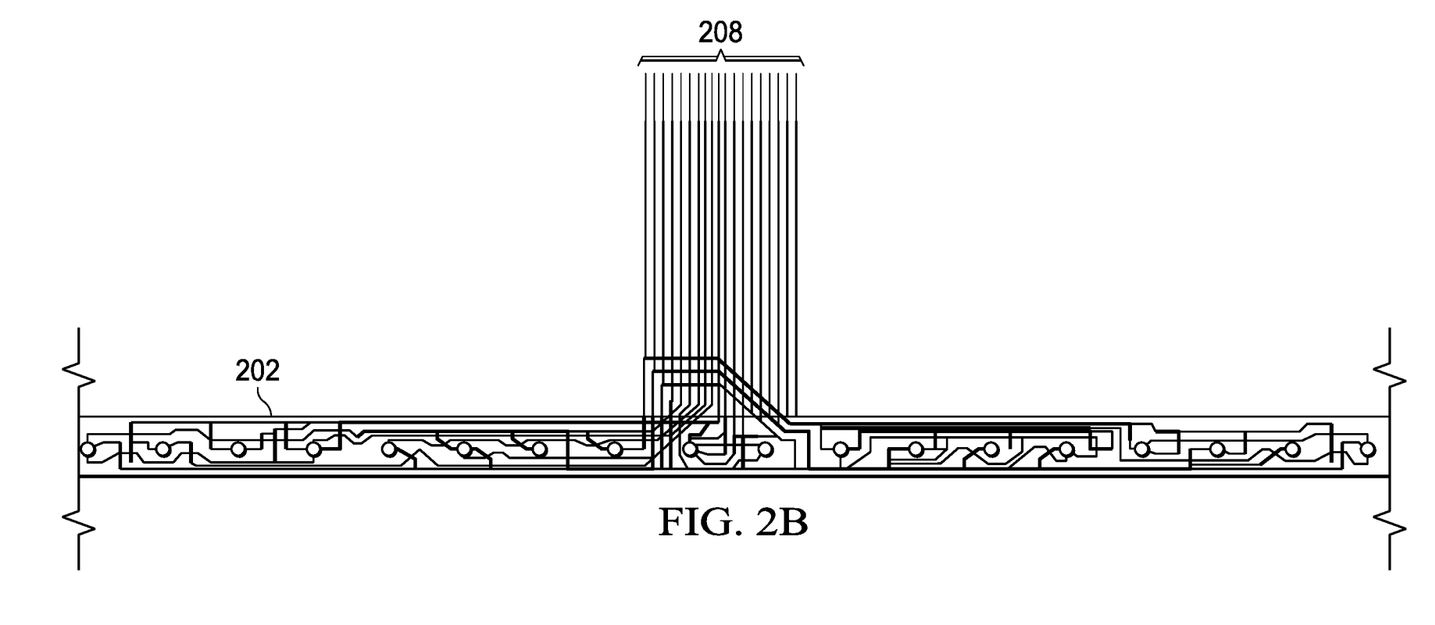
FIG. 2B illustrates exemplary conductors configured to electrically couple signals to LEDs disposed along a length of the membrane.
Figure 2C:
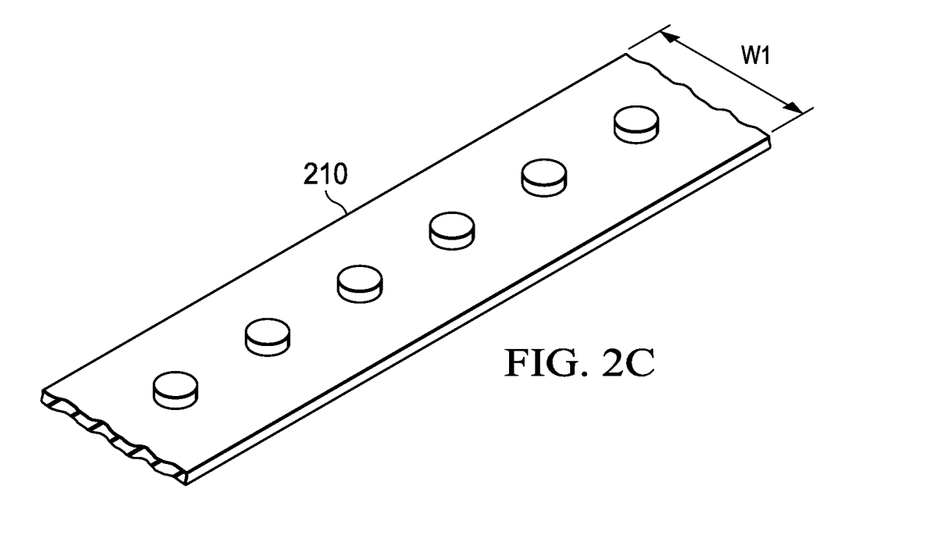
FIG. 2C illustrates an exemplary membrane including N LEDs and corresponding electrical conductors disposed along a length of the membrane.
Figure 2D:
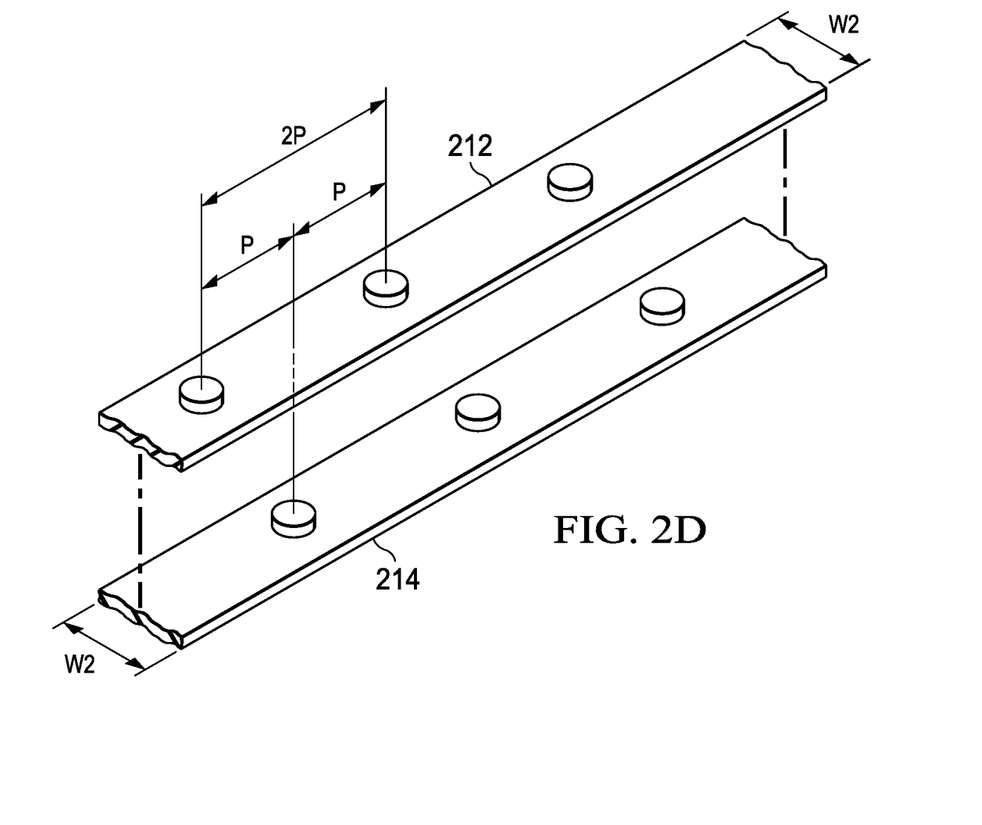
FIG. 2D illustrates a three-dimensional exploded view of exemplary stacked membrane layers, each membrane layer including N/2 LEDs and corresponding electrical conductors disposed along a length of the membrane layer.

FIG. 2B illustrates exemplary conductors and electrical interconnect 208 that electrically couple signals (e.g., power and control signals) to LEDs membrane 202. Each LED of membrane 202 is individually addressable and multiple conductors disposed along a length of membrane 202 (e.g., four conductors corresponding to four signals) are coupled to each LED. Some of the conductors are shared by multiple LEDs by using time-division multiplexing or by conductors that couple the same signal to multiple LEDs. Membrane 202 is coupled to one or more RGB connectors using electrical conductors 208. For example, electrical interface 208 includes twenty conductive traces that are used to couple membrane 202 to 18 RGB junctions. FIG. 2C illustrates an exemplary membrane 210 having width W1 that is wide enough to accommodate conductors for NLEDs disposed on membrane 210 with pitch P. In some embodiments, the width of membrane 210 is reduced by implementing NLEDs with pitch P using a stack of multiple membrane layers. FIG. 2D illustrates a three-dimensional exploded view of exemplary stacked membrane layers. Each membrane layer includes N/2 LEDs with pitch 2P and corresponding electrical conductors. By reducing the number of LEDs disposed on a membrane layer, each membrane layer accommodates electrical conductors for N/2 LEDs in a width W2 that is less than width W1. Each of membrane layer 212 and membrane layer 214 includes a reduced number of LEDs disposed with pitch 2P. Membrane layer 212 and membrane layer 214 are transparent and thus, when offset-aligned from each other and stacked together, membrane layer 212 and membrane layer 214 form a membrane including LEDs with an effective pitch P. The decrease in membrane footprint achieved by the stacked membrane layers is associated with an increase in the number of RGB connectors used by the system and an increased thickness of the membrane. The two stacked membranes reduce the membrane footprint by approximately 30%-50%.

Figure 3:
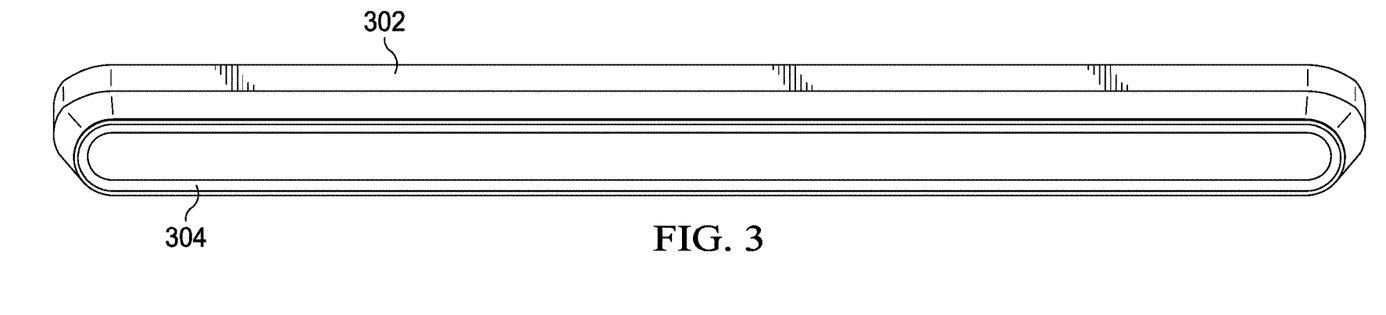
FIG. 3 illustrates a back view of an exemplary portable information handling system including a lighting feature consistent with at least one embodiment of the invention.
Figure 4:
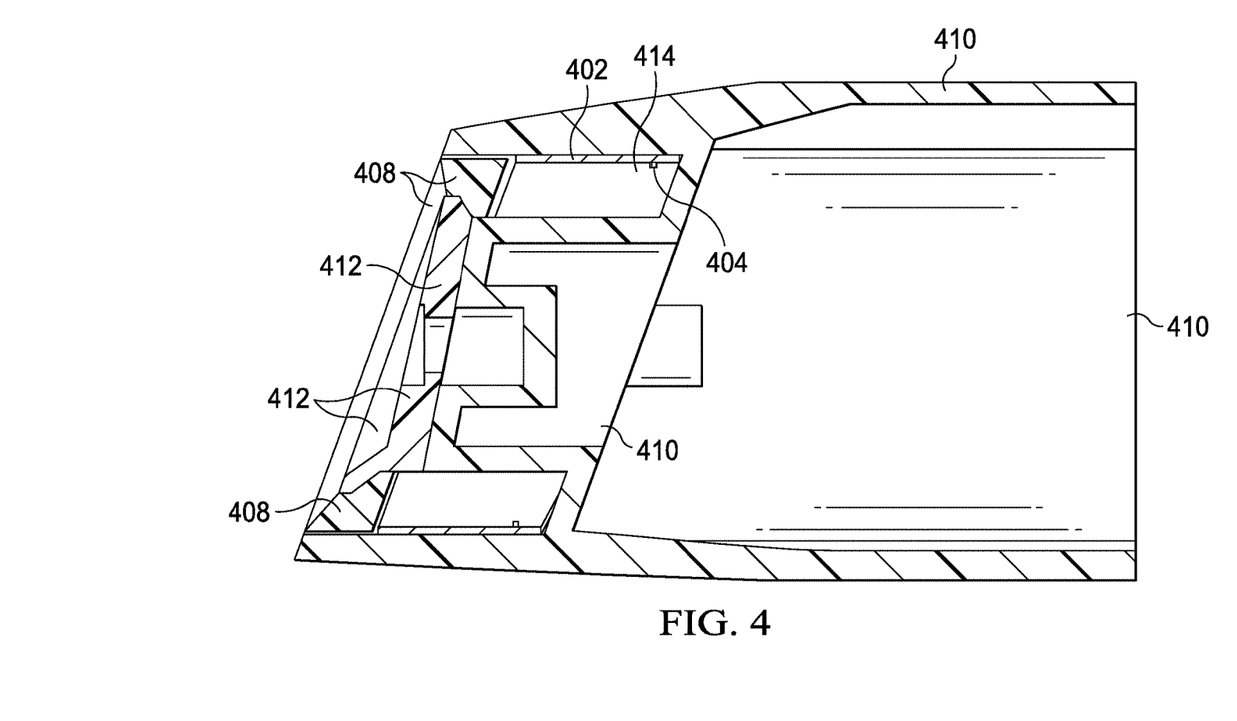
FIG. 4 illustrates a cross-sectional view of a portable information handling system including a lighting feature consistent with at least one embodiment of the invention.
Figure 5:
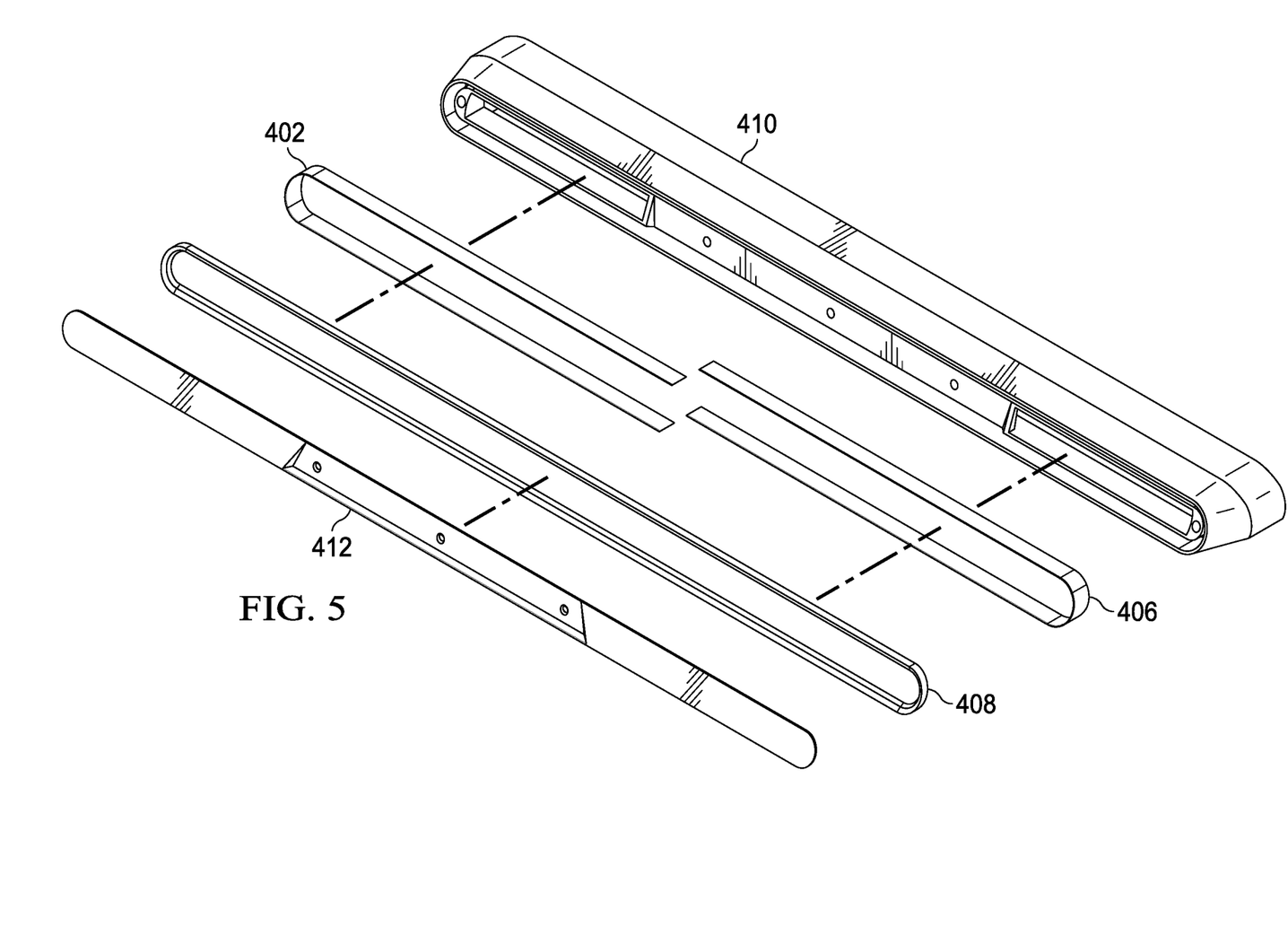
FIG. 5 illustrates a three-dimensional exploded view of a lighting feature of a portable information handling system consistent with at least one embodiment of the invention.

Referring to FIG. 3, a membrane of LEDs is included in portable information handling system 302 to form lighting feature 304, which has a non-linear, closed shape and is disposed in the rear of portable information handling system 302, which is included for aesthetic lighting. Referring to FIGS. 4 and 5, in at least one embodiment, a lighting feature is implemented using membrane 402 and membrane 406. Each membrane includes a row of LEDs and associated electrical conductors. Membrane 402 and membrane 406 are manipulated into a band-like structure that is attached to outer or inner surfaces of a niche (e.g., depression, trench, or cavity) in outer housing 410. Membrane 402 and membrane 406 are oriented such that the LEDs emit light into airgap 414. Molded diffuser 408 is inserted into the niche and closes off the niche to form airgap 414 bounded by molded diffuser 408, outer housing 410, and membrane 402 or membrane 406. Outer cover 412 inserts into molded diffuser 408 and secures molded diffuser 408 in an assembly with outer housing 410. In an embodiment, light emitted from LED 404 into airgap 414 and out through molded diffuser 408 has uniform intensity is achieved, e.g., individual LEDs are indiscernible by the naked eye when airgap 414 has a y-dimension that is greater than or equal to pitch, P, of the LEDs. However, the y-dimension that achieves uniform light intensity varies with the material used to form molded diffuser 408.

In an embodiment, molded diffuser 408 is formed from a polycarbonate material including pigment or other additives (e.g., titanium dioxide, zinc oxide, or silicon dioxide) that add diffusing properties to the polycarbonate material. In at least one embodiment, the pigment content, is approximately 0.2-1% by weight, and may vary according to the amount of diffusion needed in a target application. Molding or machining techniques shape the polycarbonate into a target shape, which has a non-linear or complex shape. In at least one embodiment, molded diffuser 408 is formed from polycarbonate materials capable of being injection molded with high haze/diffusion of approximately 50% and transmittance of approximately 60%. Some embodiments of molded diffuser 408 use a thermoformed acrylic material. In at least one embodiment, molded diffuser 408, outer housing 410, and outer cover 412 are molded or machined such that outer cover 412 can snaps into place, thereby securing membrane 402, membrane 406, and molded diffuser 408 to outer housing 410.

Figure 6:
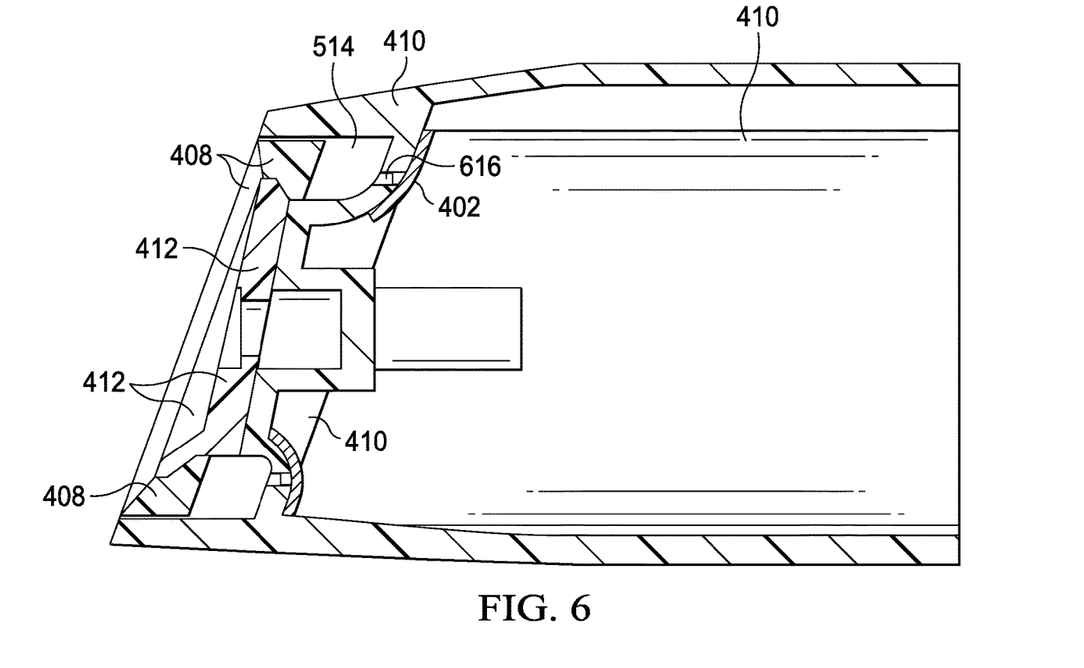
FIG. 6 illustrates a cross-sectional view of a lighting feature of a portable information handling system including a membrane including LEDs disposed internal to a housing consistent with at least one embodiment of the invention.

FIG. 6 illustrates a lighting feature of a portable information handling system that has smaller y-dimension requirements than the lighting feature of FIGS. 4 and 5. In the embodiment of FIG. 6, membrane 402 is secured to outer housing 410 on an inner surface of outer housing 410. Attachment (e.g., by adhesive bonding) to outer housing 410 causes membrane 402 and membrane 406 to curl in conformance to the inner surface of outer housing 410. Aperture 616 is an aperture through the surface of outer housing 410 and transmits light emitted by the LED of membrane 402 or membrane 406 into air gap 514. Molded diffuser 408, which is disposed in a niche of outer housing 410, closes off the niche, forms airgap 514 bounded by molded diffuser 408, outer housing 410, and membrane 402 or membrane 406. Outer cover 412, which snaps into place, secures molded diffuser 408 into an assembly with outer housing 410.

Figure 7:
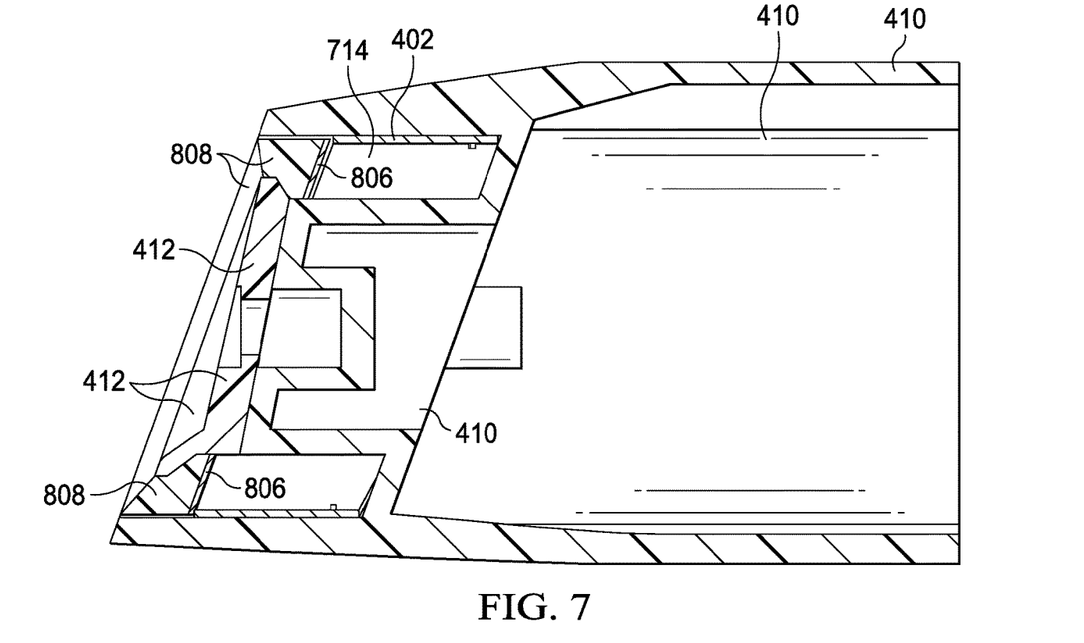
FIG. 7 illustrates a cross-sectional view of a lighting feature of a portable information handling system including a diffuser film and outer plastic piece consistent with at least one embodiment of the invention.
Figure 8:
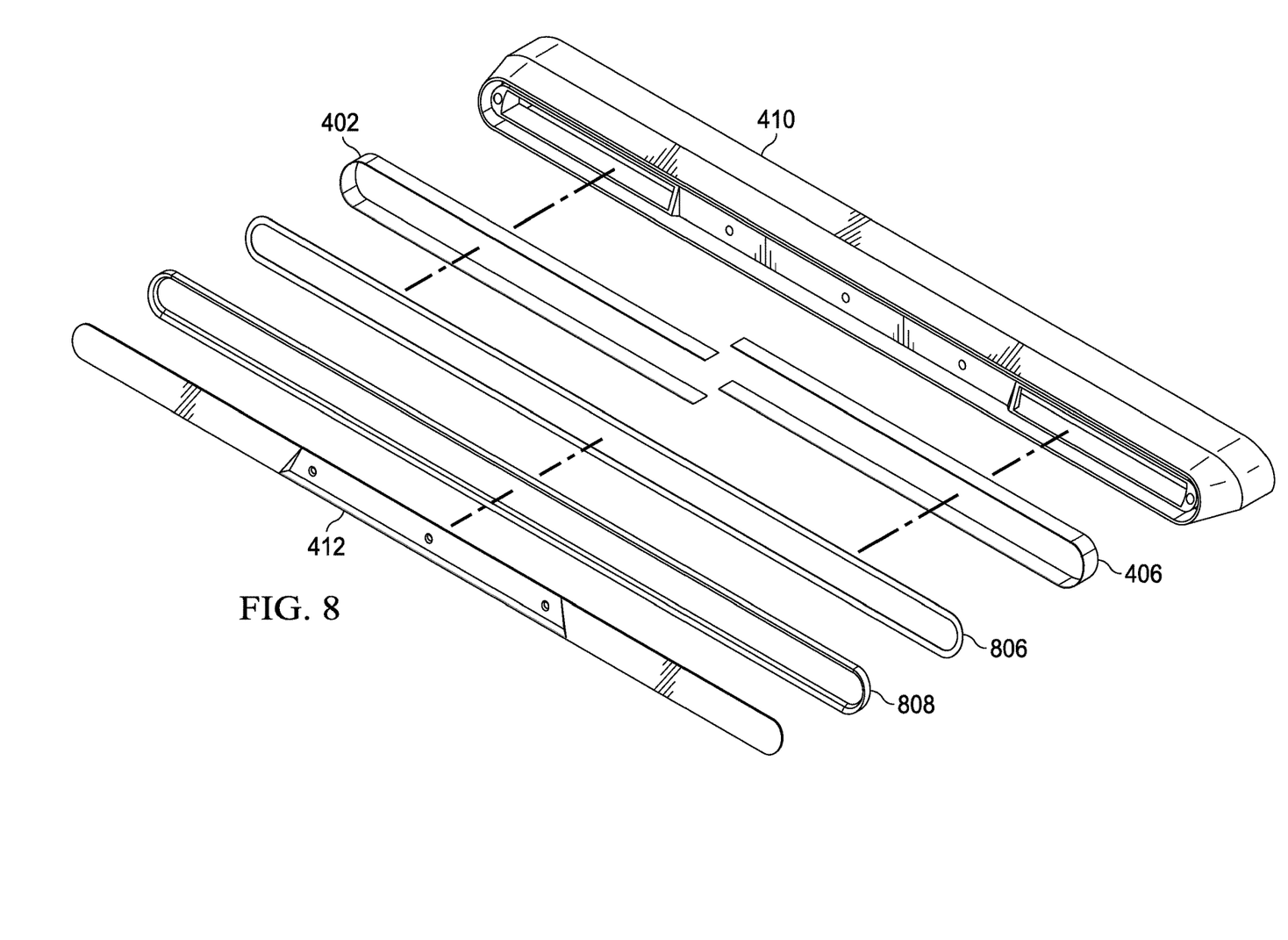
FIG. 8 illustrates a three-dimensional exploded view of a lighting feature of a portable information handling system using a diffuser film and outer plastic piece consistent with at least one embodiment of the invention.

In at least one embodiment, a lighting feature is implemented using a diffusion film and an outer plastic piece, which may be simpler to manufacture than molded diffuser 408 of FIGS. 4-6. Referring to FIGS. 7 and 8, in at least one embodiment, a lighting feature is implemented using diffusion film 806 and outer plastic piece 808, which is transparent. In at least one embodiment, diffusion film 806 is a light-diffusing film, such as an elliptical diffusing film with various diffusion strengths (e.g., 60 degree: 1 degree) or a circular diffuser with various diffusion strengths (e.g., 60 degree: 15 degree) that achieve light output having uniform intensity. Diffusion film 806 and outer plastic piece 808 close off a niche of outer housing 410 and form airgap 714 bounded by outer plastic piece 808, outer housing 410, and membrane 402, and membrane 406. Outer cover 412 secures outer plastic piece 808 and diffusion film 806 to form an assembly with outer product housing 410.

Figure 9:
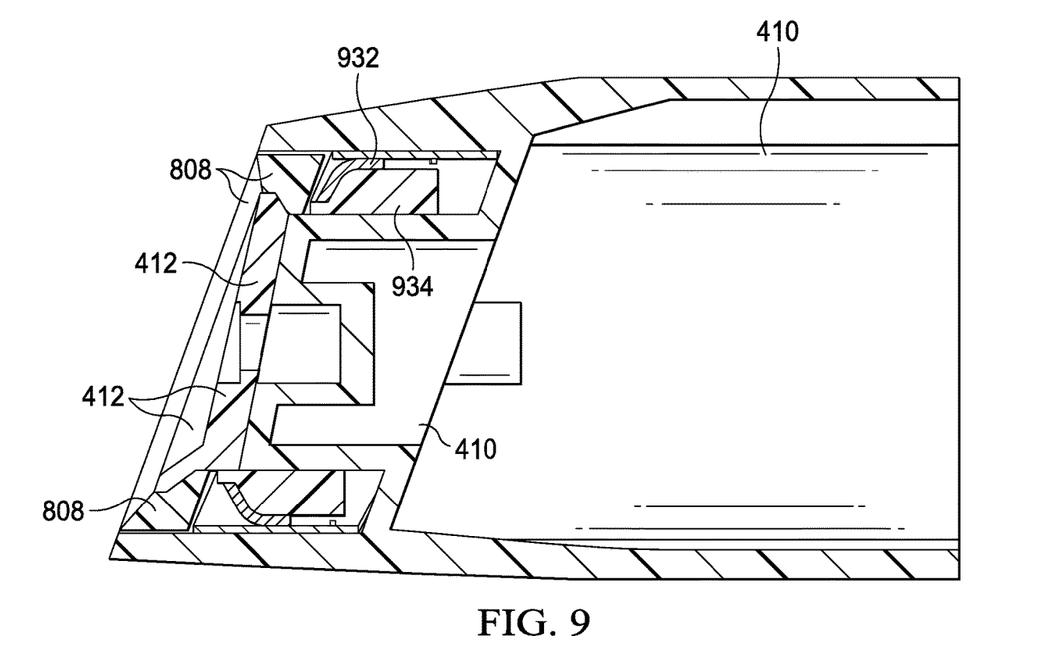
FIG. 9 illustrates a cross-sectional view of a lighting feature of a portable information handling system including a diffuser and a curved waveguide consistent with at least one embodiment of the invention.
Figure 10:
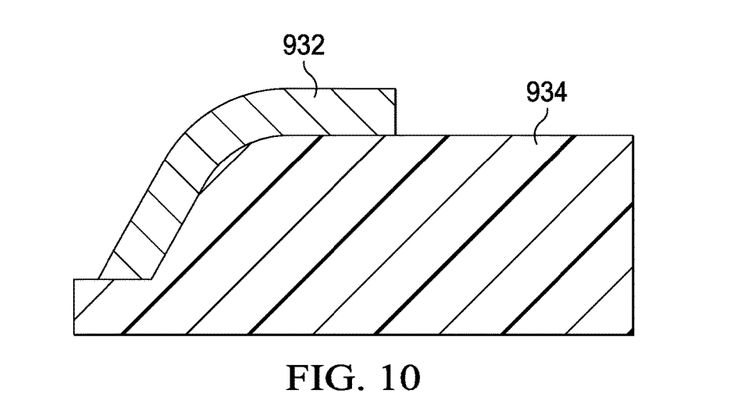
FIG. 10 illustrates a detailed view of the diffuser and curved waveguide of FIG. 9 consistent with at least one embodiment of the invention.
Figure 11:
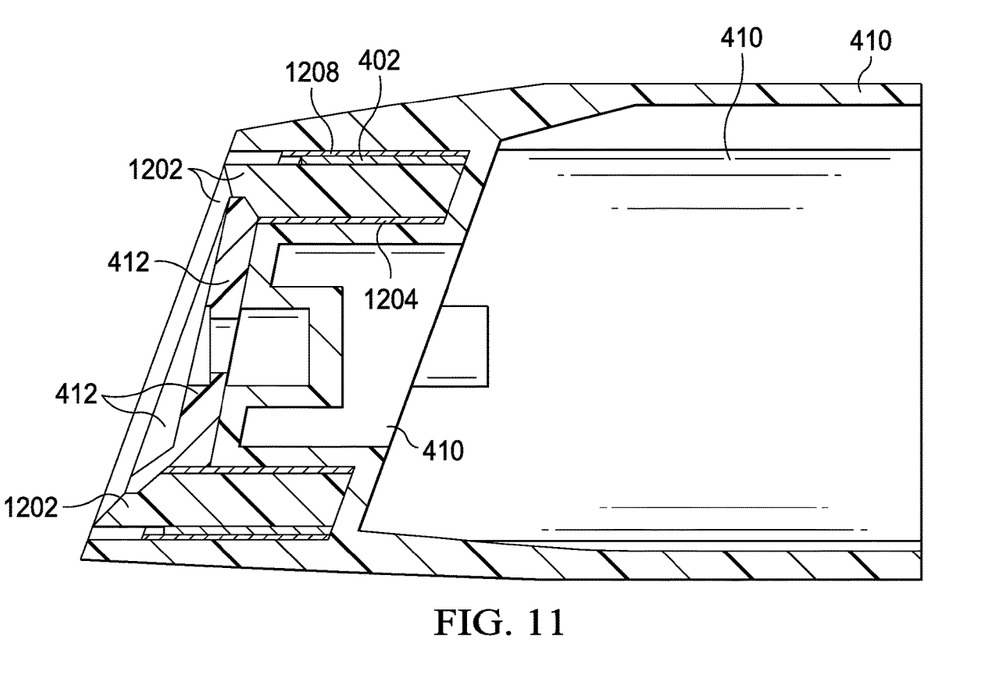
FIG. 11 illustrates a cross-sectional view of a lighting feature of a portable information handling system including a reflector and a membrane including LEDs attached to a diffuser consistent with at least one embodiment of the invention.
Figure 12:
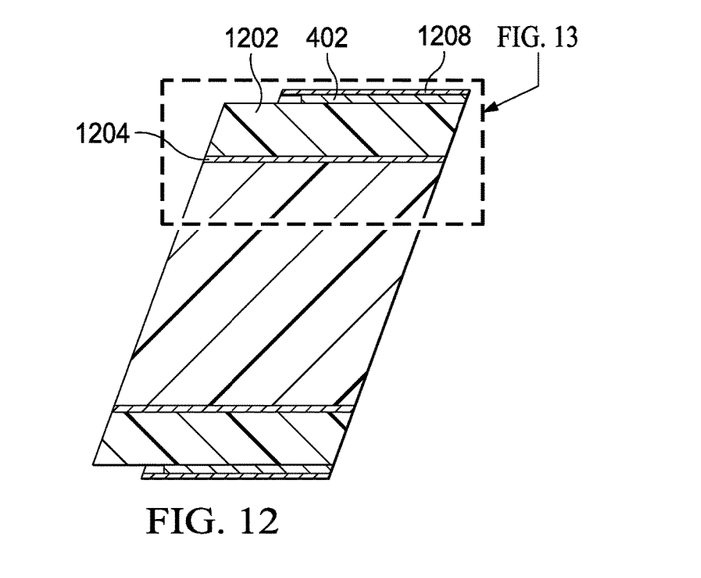
FIG. 12 illustrates a detailed, cross-sectional view of the lighting feature of FIG. 11, consistent with at least one embodiment of the invention.
Figure 13:
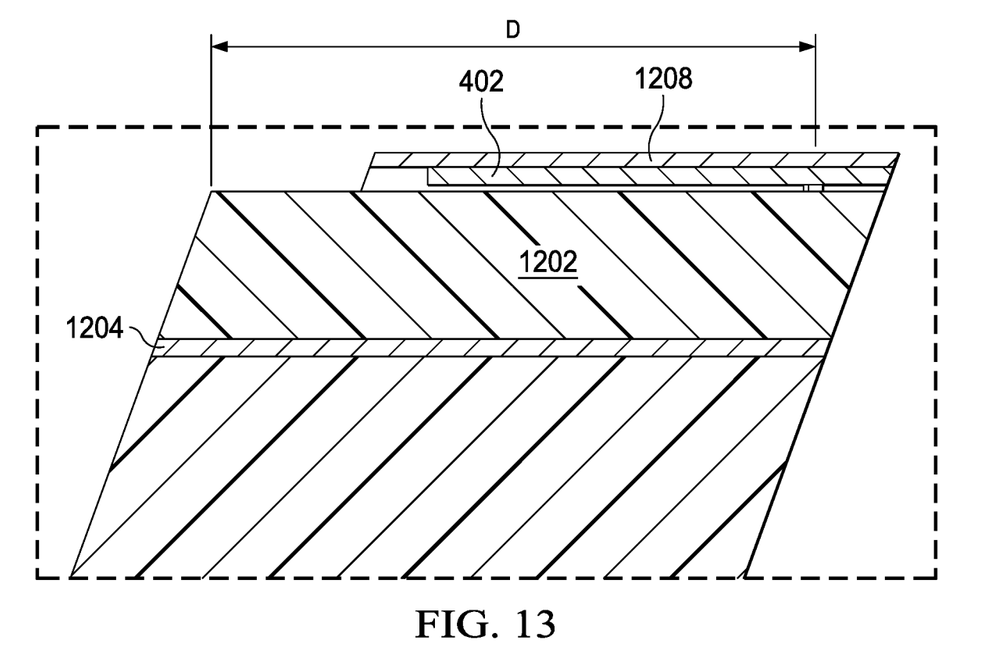
FIG. 13 illustrates a detailed view of the cross-sectional view of the lighting feature of FIG. 11, consistent with at least one embodiment of the invention.
Figure 14:
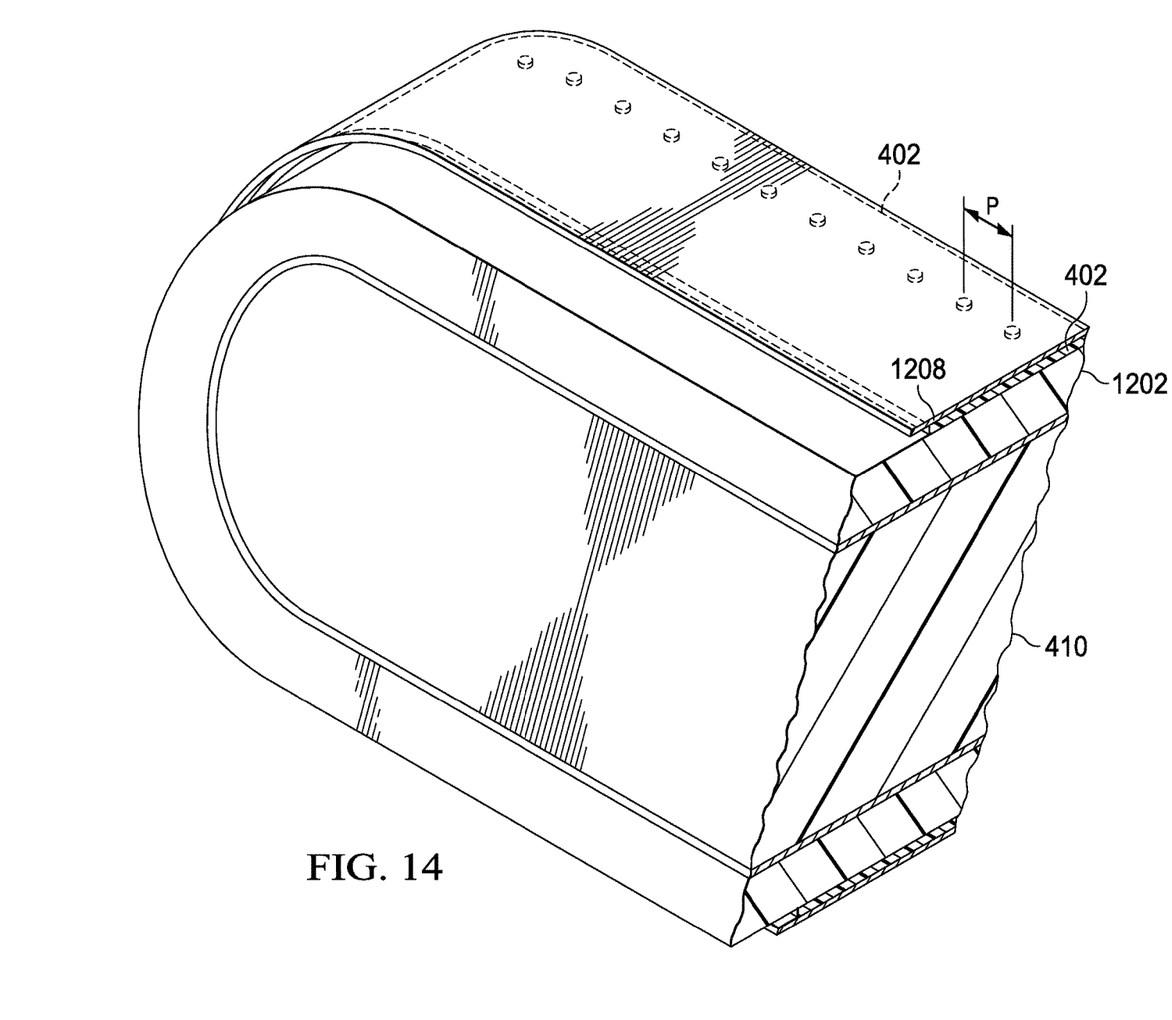
FIG. 14 illustrates a portion of a lighting feature of the portable information handling system of FIG. 11, consistent with at least one embodiment of the invention.

In embodiments with an outer plastic piece having a complex shape, improved uniformity of light intensity is achieved when light emitted from the LEDs is uniform prior to incidence with the outer plastic piece. A diffuser and a reflective element are used in combination to achieve uniform light intensity output of a curved lightguide. For example, referring to FIGS. 9 and 10, curved lightguide film 932 is attached to carrier 934, which has reflective properties. In at least one embodiment, curved lightguide film 932 is a polycarbonate or acrylic-based light diffusing film and carrier 934, which is included to support curved lightguide film 932, is formed from an opaque polycarbonate material. The assembly of curved lightguide film 932 and carrier 934 close off a niche of outer housing 410. Outer plastic piece 808 attaches to outer housing 410. Although an airgap may be present, an airgap is not needed in such embodiments. Outer cover 412 secures outer plastic piece 808 to outer housing 410.

In at least one embodiment, a diffuser extends to the back of a niche in outer housing 410, thus no air-gap exists in the y-direction. Referring to FIGS. 11-14, reflector 1208 is adjacent to membrane 402, which is adjacent to diffuser 1202. Diffuser 1202, which has a surface adjacent to reflector 1204, extends to the back of the niche in outer housing 410 and no air gap is present in the y-direction. This embodiment allows for more precise placement of membrane 402 and maintains a distance, D, between the LED on the membrane and an outer surface of diffuser 1202 such that D is greater than or equal to pitch, P, of the LEDs. Thus, sufficient diffusion distance results in a lighting feature that generates uniform light intensity as viewed from outside outer housing 410. In at least one embodiment, reflector 1204 and reflector 1204 are formed from polyester-based films or polyolefin-based films.

Figure 15:
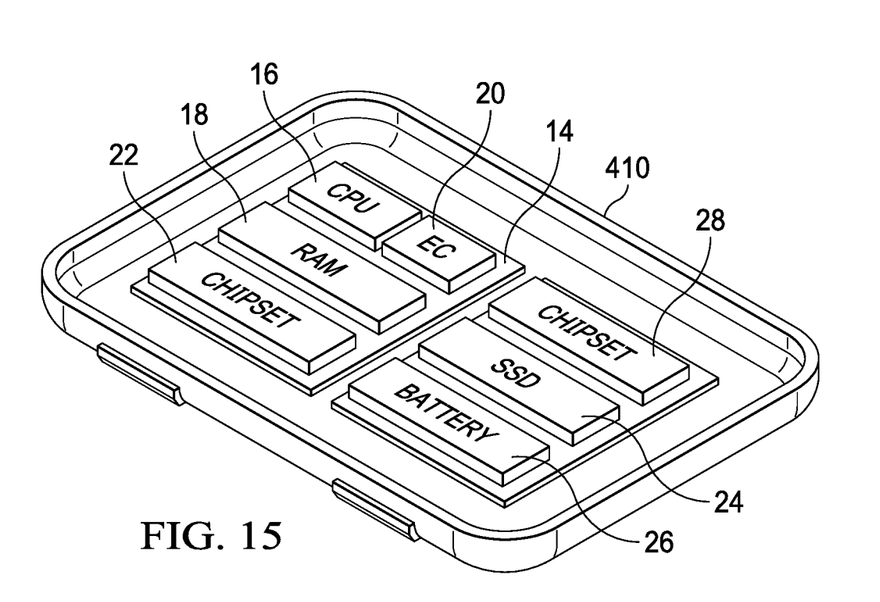
FIG. 15 illustrates an exemplary motherboard in an outer housing of a portable information handling system having a lighting feature consistent with at least one embodiment of the invention.

Referring to FIG. 15, in at least one embodiment, outer housing 410 contains a processor coupled to the lighting feature (e.g., a central processing unit (CPU) or embedded controller (EC)) coupled to the 4-pin RGB connector of a membrane). The processor executes instructions fetched from memory to configure the LEDs to cause the lighting feature to have characteristics based on user preferences or target application specifications. Those characteristics may be user-configurable according to user preferences or according to an application executing on the information handling system. In at least one embodiment, 72 individually addressable RGB LEDs are included on the membrane. By varying the level of red, green, and blue per LED, various colors can be achieved.

Referring to FIG. 16, in at least one embodiment of an information handling system, outer housing 410 includes a motherboard 14 supporting processing components that cooperate to process information. For example, CPU 16 executes instructions to process information stored in a random-access memory (RAM) 18, such as instructions of an operating system and applications. Embedded controller 20 manages power and interactions with input/output devices, such as the membrane of a lighting feature described herein. Chipset 28 manages operation of CPU 16, such as providing power, clock and memory access functions. In an exemplary embodiment, motherboard 14 fits into outer housing portion 410 along with other components, such as solid-state drive (SSD) 24 and battery 26. In addition to the components depicted in the exemplary embodiment, other types of components may be included, such as to support graphics processing, wireless communication, or peripheral device interfaces.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Thus, techniques for generating uniform intensity light for complicated shapes of a lighting feature at reduced power consumption and smaller form factors than conventional lighting features have been disclosed. The description of the invention set forth herein is illustrative and is not intended to limit the scope of the invention as set forth in the following claims. For example, while the invention has been described in an embodiment in which a portable information handling system implements the invention, one of skill in the art will appreciate that the teachings herein can be utilized with other information handling system components in other locations of the system (e.g., desktop computers, storage towers, etc.). In addition, although the invention has been described in an embodiment in which the lighting feature is intended for aesthetic lighting of the backside of a portable information handling system, one of skill in the art will appreciate that the teachings herein can be utilized in functional lighting to communicate information provided by embedded controller 20 or CPU 16, or in other locations of an information handling system (e.g., frontside, part of a display, accessory, keyboard, peripheral device, etc.). The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. An information handling system comprising:
   an outer housing;
   a processor disposed in the outer housing, the processor being configured to execute instructions to process information;
   a memory disposed in the outer housing, the memory being configured to store the information;
   a membrane including a plurality of light-emitting diodes (LEDs) and corresponding electrical conductors disposed along a length of the membrane; and
   a diffuser configured to diffuse light emitted by the plurality of LEDs to provide light having uniform intensity over a contiguous path along the outer housing,
   wherein the membrane is disposed in a band-like structure attached to a surface of a niche in the outer housing and disposed to maintain a distance D between the LEDs and an outer surface of the diffuser, where distance D is greater than or equal to pitch P of the LEDs.

2. The information handling system, as recited in claim 1, wherein the contiguous path includes at least one bend having a bend radius $r_b$, where 10 mm>$r_b$ ≥5 mm.

3. The information handling system, as recited in claim 1, further comprising:
   an outer cover, a portion of the diffuser being disposed between the outer housing and the outer cover.

4. The information handling system, as recited in claim 1, wherein the diffuser comprises:
   a molded diffuser; and
   an airgap disposed between the membrane, the outer housing, and the molded diffuser, wherein the membrane is mounted in the niche of the outer housing and oriented to emit light into the airgap, wherein the airgap has a dimension between the membrane and the molded diffuser that is greater than or equal to a pitch of the plurality of LEDs along the length of the membrane.

5. The information handling system, as recited in claim 1, wherein the diffuser comprises:
a molded diffuser; and
an airgap disposed between the membrane, the outer housing, and the molded diffuser,
wherein the membrane is mounted on an inner surface of the outer housing, the membrane being oriented to cause the LEDs to emit light through an aperture through the outer housing.

6. The information handling system, as recited in claim 5, wherein the inner surface is curved and the membrane is curled in conformance to the inner surface.

7. The information handling system, as recited in claim 1, wherein the diffuser comprises:
an outer molded plastic insert;
a diffuser film attached to the outer molded plastic insert; and
an airgap disposed between the membrane and the diffuser film.

8. The information handling system, as recited in claim 1, wherein the diffuser comprises:
an outer molded plastic insert;
a curved light guide with reflective properties; and
a diffusive film conforming to the curved light guide.

9. The information handling system, as recited in claim 1, further comprising:
a first reflector, the membrane being attached to a first surface of the diffuser between the diffuser and the first reflector; and
a second reflector attached to a second surface of the diffuser, the second surface opposing the first surface,
wherein the diffuser is disposed between two surfaces of the niche in the outer housing.

10. The information handling system, as recited in claim 1, wherein the outer housing includes the niche in the outer housing along the contiguous path, the diffuser and the membrane banding a protrusion in the surface bounded by walls of the niche.

11. The information handling system, as recited in claim 1, further comprising:
a 4-pin RGB connector electrically coupling the processor to the plurality of LEDs via the corresponding electrical conductors.

12. The information handling system, as recited in claim 1, wherein the membrane is flexible and has a minimum bend radius that is less than 10 millimeters.

13. The information handling system, as recited in claim 1, wherein the membrane is transparent and is included in a stack of multiple membrane layers including N LEDs with pitch P, and the membrane has a ribbon-like shape narrower than a width sufficient to accommodate conductors for NLEDs disposed on the membrane with pitch P, where N is an integer greater than one and each membrane layer of the stack of multiple membrane layers includes fewer than NLEDs.

14. A method for manufacturing an information handling system, the method comprising:
attaching a membrane to a diffuser or an outer housing of the information handling system, the membrane including a plurality of light-emitting diodes (LEDs) and corresponding electrical conductors disposed along a length of the membrane and the diffuser being configured to diffuse light emitted by the plurality of LEDs to provide light having uniform intensity over a contiguous path along the outer housing; and
inserting the diffuser into a niche in the outer housing,
wherein the membrane is flexible and has a minimum bend radius that is less than 10 millimeters.

15. The method, as recited in claim 14, wherein the contiguous path includes at least one bend having a bend radius $r_b$, where 10 mm $> r_b \geq$ 5 mm.

16. The method, as recited in claim 14, wherein the membrane is attached to the outer housing, the method further comprising:
mounting the membrane in the niche of the outer housing, the membrane being oriented to emit light into an airgap between the membrane, the outer housing, and the diffuser,
wherein the airgap has a dimension between the LEDs and the diffuser that is greater than or equal to a pitch of the plurality of LEDs along the length of the membrane.

17. The method, as recited in claim 14, wherein the membrane is attached to the outer housing, the method further comprising:
mounting the membrane on an inner surface of the outer housing, the membrane being oriented to cause the LEDs to emit light through an aperture through the outer housing, and into an airgap formed by the outer housing and the diffuser.

18. The method, as recited in claim 14, further comprising:
attaching a diffuser film to an outer molded plastic insert; and
inserting the diffuser film and the outer molded plastic insert into the niche in the outer housing thereby forming an airgap between the membrane and the diffuser film.

19. The method, as recited in claim 14, further comprising:
attaching a diffusive film to a curved light guide with reflective properties.

20. The method, as recited in claim 14, further comprising:
attaching the membrane to a first surface of the diffuser between the diffuser and a first reflector; and
attaching a second reflector to a second surface of the diffuser, the second surface opposing the first surface,
wherein the diffuser is disposed between two surfaces of the niche in the outer housing.

21. The method, as recited in claim 14, further comprising:
inserting an outer cover into the niche in the outer housing, a portion of the diffuser being disposed between the outer housing and the outer cover.

22. An apparatus comprising:
an outer housing;
a membrane including a plurality of light-emitting diodes (LEDs) and corresponding electrical conductors disposed along a length of the membrane; and
a diffuser configured to diffuse light emitted by the plurality of LEDs to provide light having uniform intensity over a contiguous path along the outer housing,
wherein the membrane is flexible and has a minimum bend radius that is less than 10 millimeters.

23. The apparatus, as recited in claim 22, wherein the membrane is disposed in a band-like structure attached to a surface of a niche in the outer housing and disposed to maintain a distance D between the LEDs and an outer surface of the diffuser, where distance D is greater than or equal to pitch P of the LEDs.

\* \* \* \* \*